(12) United States Patent
Hara

(10) Patent No.: US 6,455,227 B1
(45) Date of Patent: Sep. 24, 2002

(54) MULTILAYER RESIST STRUCTURE, AND METHOD OF MANUFACTURING THREE-DIMENSIONAL MICROSTRUCTURE WITH USE THEREOF

(75) Inventor: Masaki Hara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/473,655

(22) Filed: Dec. 29, 1999

(30) Foreign Application Priority Data

Jan. 6, 1999 (JP) .......................................... 11-001230

(51) Int. Cl.[7] ................................................. G03F 7/26
(52) U.S. Cl. ...................... 430/273.1; 430/14; 430/502; 430/271.1; 430/270.1; 430/312; 430/313; 430/322; 430/394
(58) Field of Search ....................... 430/14, 502, 270.1, 430/271.1, 272.1, 273.1, 312, 322, 314, 394

(56) References Cited

U.S. PATENT DOCUMENTS

| | | | | |
|---|---|---|---|---|
| 4,370,405 A | * | 1/1983 | O'Toole et al. ............. | 430/312 |
| 4,557,797 A | * | 12/1985 | Fuller et al. ................ | 156/643 |
| 4,568,411 A | * | 2/1986 | Martin ........................ | 156/655 |
| 4,738,916 A | * | 4/1988 | Namatsu et al. ............. | 430/272 |
| 5,963,283 A | * | 10/1999 | Omae et al. .................. | 349/86 |
| 5,965,934 A | * | 10/1999 | Cheung et al. .............. | 257/642 |
| 6,156,665 A | * | 12/2000 | Hamm et al. ................ | 438/706 |
| 6,165,695 A | * | 12/2000 | Yang et al. .................. | 430/314 |
| 6,177,231 B1 | * | 1/2001 | Ishii et al. ................ | 430/273.1 |
| 6,191,006 B1 | * | 2/2001 | Mori ........................... | 438/455 |
| 2002/0001778 A1 | * | 1/2002 | Latchford et al. .......... | 430/313 |

* cited by examiner

Primary Examiner—John S. Chu
Assistant Examiner—Yvette M. Clarke
(74) Attorney, Agent, or Firm—Sonnenschein, Nath & Rosenthal

(57) ABSTRACT

A multilayer resist structure is irradiated more than one time with ultraviolet rays through a photomask. Each time the structure is irradiated, ultraviolet rays of a little greater quantity of light than those used in the last irradiation are used. Also, with each exposure, a photomask which has a larger lightproof section than that used in the last irradiation is used. Next, the multilayer resist structure is developed, and the exposed area of each photoresist is removed with a developing solution. Also, in amorphous silicon layers, the areas under the removed photoresist are easily removed with the developing solution. A resist structure having desired steps is thus completed. Using the resist structure, a three-dimensional microstructure can be formed.

12 Claims, 3 Drawing Sheets

MULTILAYER RESIST STRUCTURE, AND METHOD OF MANUFACTURING THREE-DIMENSIONAL MICROSTRUCTURE WITH USE THEREOF

BACKGROUND OF THE INVENTION

1. Field of the Invention

The present invention relates to a multilayer resist structure suitable for manufacturing a three-dimensional microstructure in MEMS (Micro Electro Mechanical Systems) and a method for manufacturing a three-dimensional microstructure with use of the multilayer resist structure.

2. Description of the Related Art

In recent years, with a demand for a scale-down of a semiconductor integrated circuit, a method for manufacturing a three-dimensional microstructure, such as a multilevel intersection in the case of, for example, wiring, with stability is required.

According to the related art, such a three-dimensional microstructure has been manufactured by using a multilayer resist structure. A multilayer resist structure is comprised of resist (photoresist) layers laid one upon another. After a multilayer resist structure is formed on a substrate, the film thicknesses in the multilayer resist structure are controlled part-to-part by selectively exposing the structure according to a desired pattern and selectively removing the resist layers by dry-etching. Then, wiring structures and the like are constructed by using the multilayer resist structure. Another method to control the film thicknesses of resist layers part-to-part is to selectively irradiate a single-layered resist with light of different intensity according to a desired pattern (refer to, for example, Digest of Papers Microprocesses and Nanotechnology 1998, p. 87–88, by Chang-Wook Beak and Yong-Kweon Kim).

However, with the related art mentioned above, it is very difficult to control the film thicknesses of resist layers part-to-part. For example, in the former method, the film thicknesses in a multi-layered resist are controlled by using differences in etching speed of dry-etching between the resist layers. Exact control over the film thicknesses part-to-part is not possible because of the variation in etching speed from lot to lot. As a result, a three-dimensional microstructure with high precision cannot be formed.

On the other hand, in the method of controlling the film thicknesses part-to-part by irradiating a single-layered resist with light of different intensity (or quantity of light), a slight variation in light intensity (or quantity of light) may result in a variation in depth of the developed pattern. Therefore, exact control over the film thicknesses can not be executed by this method either.

SUMMARY OF THE INVENTION

The invention has been made in view of the above-described problems. An object of the invention is to provide a multilayer resist structure which enables exact control over the film thicknesses part-to-part after exposure and development, and enables forming a three-dimensional microstructure with high precision.

Another object of the invention is to provide a method for manufacturing a three-dimensional microstructure, which enables forming a three-dimensional microstructure with high precision by using the multi-layer resist structure.

A multilayer resist structure according to the invention comprises a plurality of resist layers laid one upon another with an absorption layer capable of absorbing beams for exposure sandwiched between each two of the resist layers. For an absorption layer, an amorphous semiconductor such as amorphous silicon, a polycrystal semiconductor such as polycrystal silicon, amorphous carbon or the like is used. A resist as used herein refers to not only photoresist but also electron-sensitive resin. A beam for exposure as used herein refers to not only light such as ultraviolet rays but also electronic beam.

A method for manufacturing a three-dimensional microstructure according to the invention uses the multilayer resist structure. Specifically, in the method, the intensity or the irradiation quantity of the beam for exposure applied to the multilayer resist structure is altered according to a desired pattern. Especially, when absorption layer is formed of amorphous silicon or polycrystal silicon, it is possible to perform patterning while removing the absorption layers together with the resist layers with a developing solution.

In the multilayer resist structure according to the invention, an absorption layer capable of absorbing beams for exposure is sandwiched between each two of the resist layers. As a result, excess beams are prevented from being transmitted to a resist layer under the absorption layer at the time of exposure, and the film thicknesses after exposure and development become stable part-to-part. Furthermore, with the method for manufacturing a three-dimensional microstructure according to the invention, the multilayer resist structure according to the invention is used. Therefore, a stable three-dimensional microstructure can be formed.

Other and further objects, features and advantages of the invention will appear more fully from the following description.

DETAILED DESCRIPTION OF THE PREFERRED EMBODIMENTS

An embodiment of the invention will now be described below in detail making reference to the accompanying drawings.

Figure 1:
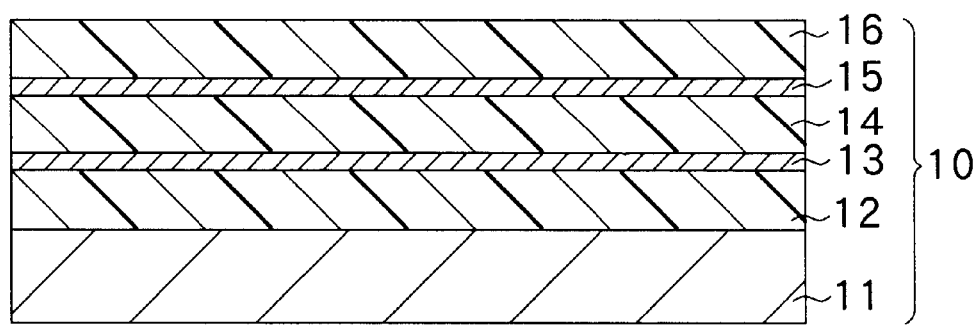
FIG. 1 is a cross-sectional view illustrating the configuration of a multilayer resist structure according to one embodiment of the invention.

FIG. 1 shows a cross-section of a multilayer resist structure (in the figure, three-layered structure) according to one embodiment of the invention. The multilayer resist structure 10 has a three-layered structure formed of photoresist layers 12, 14 and 16, with, for example, amorphous silicon layers 13 and 15 as light absorption layers sandwiched between the photoresist layers 12 and 14, and 14 and 16, respectively. The multilayer resist structure 10 is manufactured by the following method.

First, a positive photoresist layer 12 having a film thickness of 1.0 μm is coated on a semiconductor substrate, for example, a silicon wafer 11 by using, for example, a spin coater. After baking the positive photoresist layer 12 at a temperature of, for example, 100° C. for 3 minutes, an amorphous silicon layer 13 having a film thickness of, for example, 5 nm is formed on the photoresist layer 12 by vapor deposition. Then, a positive photoresist layer 14 having a film thickness of, for example, 1.0 μm is coated on the amorphous silicon layer 13. After baking the positive photoresist layer 14 at a temperature of, for example, 100° C. for 3 minutes, an amorphous silicon layer 15 having a film thickness of, for example, 8 nm is formed on the photoresist layer 14 by vapor deposition. After that, a positive photoresist layer 16 having a film thickness of, for example, 1.0 μm is formed on the amorphous silicon layer 15. Thus,. a three-layered multilayer resist structure is obtained.

When the multilayer resist structure 10 is exposed by irradiation with ultraviolet rays from above as seen in the figure, the amorphous layers 13 and 15 work as buffer layers. Thereby, of the ultraviolet rays applied to the photoresist layers 16, 14 and 12, the rays exceeding the desired setting of quantity of light are prevented from being transmitted to the lower resist layers 14 and 12 more than necessary. Accordingly, by development after exposure, a multilayer resist structure and, furthermore, a three-dimensional microstructure in a desired shape, which have the same depth dimension (film thickness dimension) as the setting can be constructed according to a desired pattern.

Next, a method for forming the multilayer resist structure 10 shown in FIG. 1 into a desired stepped shape will be described specifically making reference to FIGS. 2A to 2D.

Figure 2A:
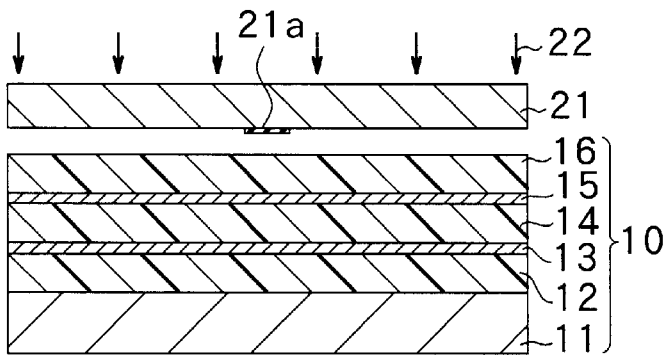
FIGS. 2A to 2D are cross-sectional views showing each process to form the multilayer resist structure shown in FIG. 1 into a stepped shape.
Figure 2B:
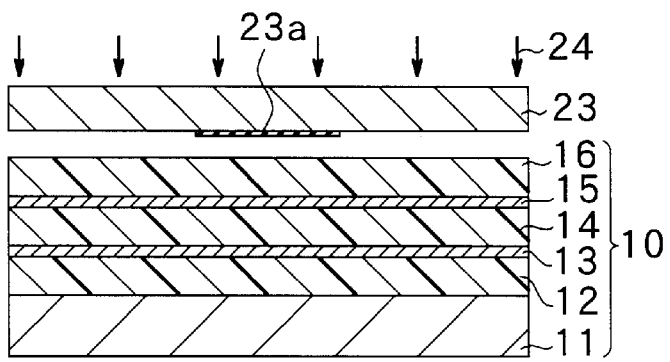

First, as shown in FIG. 2A, the multilayer resist structure 10 is irradiated with ultraviolet rays 22 of a small quantity of light by proximity (by exposing a substrate through a photomask held at a slight distance from the substrate) through a photomask 21 made of synthetic quartz and having a lightproof section 21a formed of, for example, a chromium (Cr) film. After that, as shown in FIG. 2B, the multilayer resist structure 10 is irradiated with ultraviolet rays 24 of a little greater quantity of light than the ultraviolet rays 22, by proximity through a photomask 23 having a lightproof section 23a. The lightproof section 23a has a larger area than the lightproof section 21a of the photomask 21.

Figure 2C:
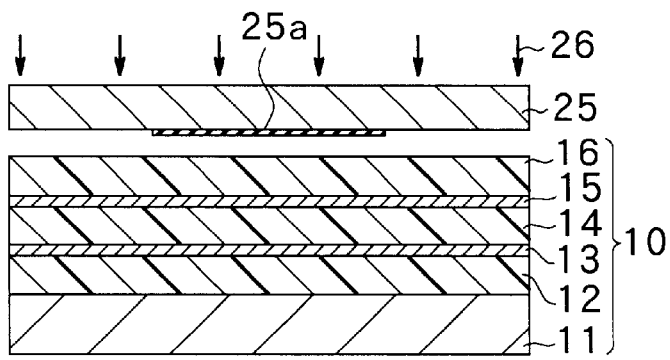
Figure 2D:
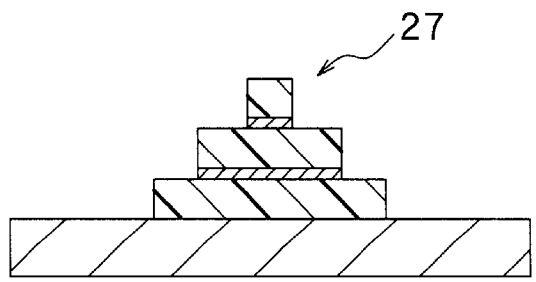

Next, as shown in FIG. 2C, the multilayer resist structure 10 is irradiated with ultraviolet rays 26 of even greater quantity of light than the ultraviolet rays 24, by proximity through a photomask 25 having a lightproof section 25a. The lightproof section 25a has a larger area than the lightproof section 23a of the photomask 23. After that, the multilayer resist structure 10 is immersed in, for example, a developing solution which is strongly alkaline. Thereby, in each of the photoresist layers 12, 14 and 16, the area irradiated with ultraviolet rays is removed with the developing solution. In the amorphous silicon layers 13 and 15, the areas under the removed photoresist is also easily removed with the developing solution. As a result, a resist structure 27 as shown in FIG. 2D with desired steps is formed.

Next, a method for manufacturing a three-dimensional microstructure with use of the resist structure 27 will be described making reference to FIGS. 3A to 3D.

Figure 3A:
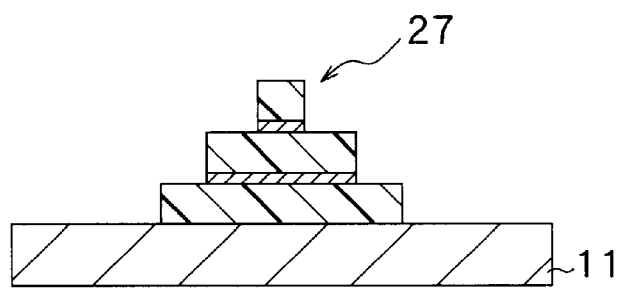
FIGS. 3A to 3D are cross-sectional views showing each process to construct a three-dimensional microstructure by using the multilayer resist structure having a stepped shape shown in FIGS. 2A to 2D.
Figure 3B:
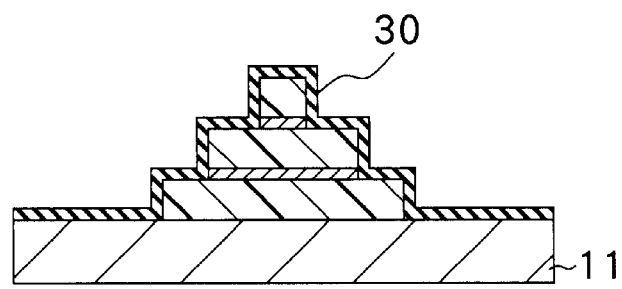
Figure 3C:
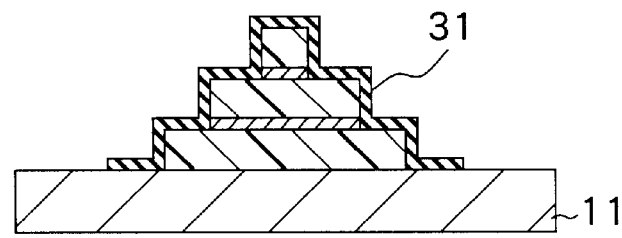
Figure 3D:
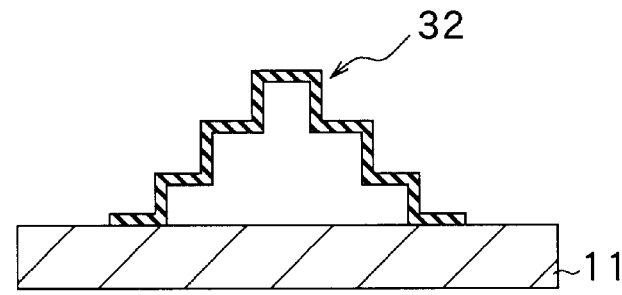

FIG. 3A shows the resist structure 27. First, as shown in FIG. 3B, a nickel (Ni) film 30 having a thickness of, for example, 0.7 μm is formed over the resist structure 27 by, for example, non-electrolyte plating. After that, as shown in FIG. 3C, a step 31 of the nickel film 30 is formed over the resist structure 27, by selectively removing the unwanted part of the nickel film 30 by dry etching. At last, the resist structure 27 is removed by using an asher (ashing system) and a chemical (for example, 3% potassium hydroxide (KOH) solution). A three-dimensional microstructure 32 as shown in FIG. 3D with desired steps formed like stairs is thus obtained.

As described above, according to the embodiment, the multilayer resist structure 10 comprised of the resist layers 12, 14 and 16, with the amorphous silicon layers 13 and 15 as absorption layers sandwiched between the resist layers 12 and 14, and 14 and 16, respectively, is formed, and exposure and development are performed by using the multilayer resist structure 10. Accordingly, the resist structure 27 having stable film thicknesses part-to-part after exposure and development is obtained. Moreover, the three-dimensional microstructure 32 with high precision can be formed by using the resist structure 27.

EXAMPLE

A specific example of the invention will now be described in detail.

First, a first positive photoresist layer of 1.0 μm in thickness was coated on a silicon wafer having a thickness of 5 inches, by using a spin coater. After baking the first positive photoresist layer at a temperature of 100° C. for 3 minutes, an amorphous silicon film having a thickness of 5 nm was deposited at a temperature of 90° C. by vapor deposition. The amorphous silicon film had an absorption coefficient of $4.2 \times 10^5$/cm in relation to ultraviolet rays (for example, g rays of 436 μm).

Next, a second positive photoresist layer of 1.0 μm in thickness was coated thereon. After baking the second positive photoresist layer at a temperature of 100° C. for 3 minutes, an amorphous silicon film having a thickness of 8 nm was deposited at a temperature of 90° C. by vapor deposition. The amorphous silicon film also had an absorption coefficient of $4.2 \times 10^5$/cm in relation to ultraviolet rays (for example, g rays of 436 nm).

Next, a third positive photoresist layer of 1.0 μm in thickness was coated thereon. After baking the third positive photoresist layer at a temperature of 100° C. for 5 minutes, a multilayer resist structure shown in FIG. 1 was formed.

Next, the multilayer resist structure was irradiated (first irradiation) with ultraviolet rays of a small intensity (g rays of 436 nm) through a photomask (a first photomask) held at a distance of 5 μm from the multilayer resist structure. The first photomask was made of synthetic quartz and had a rectangular lightproof pattern (a chromium film was used for the lightproof section). The conditions of the irradiation were energy intensity of 1.0 mW/cm$^2$, and 10 seconds. The dimensions of the lightproof pattern on the photomask were 4 μm(length)×6 μm(width).

Then, the multilayer resist structure was irradiated (second irradiation) with ultraviolet rays (g rays of 436 nm) of greater quantity of light than that used in the first irradiation, by proximity through a photomask (a second photomask) having a larger lightproof pattern than that of the first photomask. The conditions of the irradiation were energy intensity of 1.0 mW/cm², and 28 seconds. The dimensions of the lightproof pattern on the photomask were 4 μm(length)×18 μm(width).

After that, the multilayer resist structure was irradiated (third irradiation) with ultraviolet rays (g rays of 436 nm) of greater quantity than that used in the second irradiation, by proximity through a photomask (a third photomask) having an even larger lightproof pattern than that of the second photomask. The conditions of the irradiation were energy intensity of 1.0 mW/cm², and 45 seconds. The dimensions of the lightproof pattern on the photomask were 4 μm(length)× 30 μm(width).

Finally, the silicon wafer was immersed in a developing solution which was strongly alkaline, and developed for 3 minutes. Thereby, the exposed photoresist area and the amorphous silicon thereunder were removed with the developing solution. Thus, a resist structure having the dimensions of 4 μum(length)×30 μm(width) and a stepped structure, each step having a height of 1.0 μm was formed.

Next, a nickel thin film having a thickness of 0.7 μm was formed over the entire surface of the substrate, on which the multilayer resist structure was formed, by non-electrolyte plating. After that, photoresist having a thickness of 6.0 μm was coated on the entire surface of the silicon wafer. Then, the photoresist was selectively removed by photolithography, except for the photoresist covering the resist structure. Furthermore, by etching in a dry etching system using BCl₃ gas, part of the nickel film which was not covered with photoresist was removed. By the subsequent process by a resist asher, a desired pattern of a nickel film was formed on the multilayer resist structure.

As the multilayer resist structure under the nickel film was not entirely removed by the resist ashing process described above, the silicon wafer was immersed in a 3% potassium hydroxide solution heated at 60° C. for 10 minutes. Thus, the multilayer resist was completely removed. Through the processes described above, a stepped structure made of a nickel film was formed with high precision on the silicon wafer.

Although the present invention has been described with reference to the embodiment and example, it is not limited to the above-mentioned embodiment and example, but many changes and modifications are possible. For example, a film thickness of photoresist or amorphous silicon, a deposition temperature, wavelength, intensity or irradiation time of ultraviolet rays, and developing time can be changed according to processes. Also, the above-mentioned embodiment and example relate to a case in which an amorphous silicon layer is formed as a light absorption layer. However, a polycrystal silicon layer or a layer made of a semiconductor other than silicon may also be formed. Furthermore, amorphous carbon and so on may also be used.

Furthermore, although in the above-described embodiment and example, positive photoresist is used for resist layers, it is obvious that negative photoresist may also be used for resist layers.

Moreover, in the above-described embodiment and example, amorphous silicon layers as absorption layers are formed by vapor deposition. However, remote plasma CVD (Chemical Vapor Deposition), in which less ultraviolet rays are applied to the substrate during deposition, may also be used.

Furthermore, the number of photoresist layers and absorption layers is not limited to that in the above-mentioned embodiment and example. However, phororesist layers and absorption layers may be laid one upon another as far as exposure is possible.

Moreover, in the above-described embodiment and example, the intensity of ultraviolet rays is kept constant, while irradiation time is altered process by process when performing exposure. However, it is also acceptable that irradiation time is kept constant, while the intensity of ultraviolet rays is altered process by process.

Furthermore, in the above-described embodiment and example, the case in which the three-dimensional microstructure is formed of nickel is described. However, the three-dimensional microstructure may also be formed of other metals such as aluminum (Al), or polycrystal silicon, silicon nitride and so on. Any other material may be also used as long as the material offers a selective ratio with regard to resist when etching.

Moreover, in the above-described embodiment and example, a structure of symmetrical cross section is described as an example of three-dimensional microstructure. However, an asymmetrical structure such as a cantilever may also be formed.

Furthermore, the above-described embodiment and example relates to a case in which the resist layers are made of photoresist and light is used as exposure means. However, the resist layers may also be made of electron-sensitive resin, and electron beam may be used as exposure means.

As described, according to the multilayer resist structure of the invention, an absorption layer capable of absorbing beams for exposure is sandwiched between each two of the resist layers. Thus, excess beams are prevented from being transmitted to a resist layer under each of the absorption layers. The film thicknesses after exposure and development becomes stable part-to-part, and a resist structure in a desired shape is formed.

Moreover, according to the method of manufacturing a three-dimensional microstructure of the invention, the multilayer resist structure of the invention is used. Thus, a stable three-dimensional microstructure can be formed with high precision.

Obviously many modifications and variations of the present invention are possible in the light of the above teachings. It is therefore to be understood that within the scope of the appended claims the invention may be practiced otherwise than as specifically described.

What is claimed is:

1. A multilayer resist structure comprising:
   at least three resist layers laid one upon another,
   wherein an absorption layer capable of absorbing beams for exposure is sandwiched between each two of the resist layers
   and wherein at least one absorption layer is comprised of amorphous carbon.

2. A method of manufacturing a three-dimensional microstructure comprising:
   forming a multilayer resists structure,
   wherein said multilayer resist structure comprises at least three resist layers and an absorption layer capable of absorbing beams sandwiched between each two of said plurality of resist layers;

exposing said multilayer resist structure a plurality of times to form a desired pattern on said multilayer resist structure;

developing said multilayer resist structure;

forming a film on top of said developed multilayer resist structure; and removing said developed multilayer resist structure under said film to obtain a three-dimensional microstructure.

3. The method of claim 2 further comprising selectively deleting part of said film from said developed multilayer resist structure.

4. The method of claim 2 wherein said removing step is by immersion in potassium hydroxide solution.

5. The method of claim 2 wherein said resist is a positive photoresist.

6. The method of claim 2 wherein said resist comprises an electron-sensitive resin.

7. The method of claim 2 wherein said adsorption layer comprises either amorphous silicon or polycrystal silicon.

8. The method of claim 2 wherein said absorption layers are formed by vapor deposition.

9. The method of claim 2 wherein each exposing step comprises irradiation with ultraviolet light at a constant intensity to form the desired pattern.

10. The method of claim 2 wherein each exposing step comprises irradiation with ultraviolet light for a constant time at a different intensity to form the desired pattern.

11. The method of claim 2 wherein said microstructure is formed of nickel.

12. The method of claim 2 wherein said microstructure has a symmetrical cross section.

* * * * *